United States Patent
Hsieh

(10) Patent No.: US 6,524,973 B2
(45) Date of Patent: Feb. 25, 2003

(54) METHOD FOR FORMING LOW DIELECTRIC CONSTANT LAYER

(75) Inventor: Wen-Yi Hsieh, Hsin-chu (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/803,906

(22) Filed: Mar. 13, 2001

(65) Prior Publication Data

US 2002/0132494 A1 Sep. 19, 2002

(51) Int. Cl.⁷ .............................................. H01L 21/469
(52) U.S. Cl. ........................ 438/778; 438/789; 438/623
(58) Field of Search ................................. 438/584, 597, 438/622, 623, 628, 758, 788, 789

(56) References Cited

U.S. PATENT DOCUMENTS 6,284,656 B1 * 9/2001 Farrar ........................ 438/623
6,291,334 B1 * 9/2001 Somekh ..................... 438/597

* cited by examiner

*Primary Examiner*—Kamand Cuneo
*Assistant Examiner*—Lisa Kilday

(57) ABSTRACT

The present invention provides a method for forming low dielectric constant layer in a semiconductor device comprising providing the semiconductor device. A dielectric layer is formed on the semiconductor device, which has a constituent of a plurality of unsaturated carbon bonds compounds. The dielectric layer is then treated with hydrogen. The purpose of treatment of hydrogen is to form saturated carbon bonds compounds for unexhausted unsaturated carbon bonds in the dielectric layer.

17 Claims, 4 Drawing Sheets

METHOD FOR FORMING LOW DIELECTRIC CONSTANT LAYER

BACKGROUND OF THE INVENTION

1. Field of the Invention

The invention relates to a method for forming a low dielectric constant layer, and more particularly to a method for forming a low dielectric constant layer and treating the low dielectric constant layer in a semiconductor device.

2. Description of the Prior Art

It is the nature of semiconductor physics that as the feature sizes are scaled down, the performance of internal devices in integrated circuits improves in a compounded fashion. That is, the device speed as well as the functional capability improves. The overall circuit speed, however, becomes more dependent upon the propagation speed of the signals along the interconnects that connect the various devices together. With the advent of very and ultra large scale integration (VLSI and ULSI) circuits, it has therefore become even more important that the metal conductors that form the interconnections between devices as well as between circuits in a semiconductor have low resistivities for high signal propagation. Copper is often preferred for its low resistivity to electromigration and stress voiding properties.

On the other hand, considerable attention has focused on the replacement of silicon dioxide with new materials, particular material having lower dielectric constants, since both capacitive delays and power consumption depend on the dielectric constant of the insulator. Accordingly, circuit performance enhancement has been sought by combining the copper conductors with low dielectric constant insulators (k less than approximately 4).

An example of a single damascene process using a low k dielectric material is depicted in FIG. 1. A low k dielectric material 142 such as benzocyclobutene (BCB) or the material known as FLARE (manufactured by Allied Signal) is spun on an interconnect layer 140. A cap layer 144 is deposited on the low k dielectric layer 142. An another example of a dual damascene process sequence using a low k dielectric, having trenches with underlying via holes that are etched in the low k dielectric material before metal deposition and chemical-mechanical polishing, is deposited in FIG. 2. This commonly used method of forming the trenches together with the via holes employs etch stop layers and photoresist masks. A bottom stop layer 114 is deposited over an existing interconnect pattern formed in an interconnect layer 110. A layer of low k dielectric material 116 is then deposited on the bottom stop layer 114. A via 128 is formed within this low k dielectric layer 116. On the other hand, a trench 126 is formed within a second layer 122 of low k dielectric material spun coated on a middle stop layer 118.

However, these spin-on materials of low k dielectric usually have carbon double or triple bonds compounds used for forming cross-linking during curing step. Such these low k materials may have low mechanical strength, poor dimensional stability, poor temperature stability, high moisture absorption and permeation, and so on. To be specific, because of high moisture absorption, those unexhausted unsaturated bonds in curing step are susceptible to moisture to form carboxyl compound with higher k dielectric constant.

SUMMARY OF THE INVENTION

It is an object of the present invention to provide a method for low k material treatment. The unsaturated carbon bonds of low k material unexhausted in curing step are saturated for maintaining low dielectric constant.

It is another object of the present invention to provide a method for forming dielectric layer of low dielectric constant. The low k material is treated with hydrogen for saturation of unexhausted unsaturated carbon bonds.

In the present invention, a method for forming low dielectric constant layer in a semiconductor device comprises providing the semiconductor device. A dielectric layer is formed on the semiconductor device, which has a constituent of a plurality of unsaturated carbon bonds compounds. The dielectric layer is then treated with hydrogen.

BRIEF DESCRIPTION OF THE DRAWINGS

A better understanding of the invention may be derived by reading the following detailed description with reference to the accompanying drawing wherein.

DESCRIPTION OF THE PREFERRED EMBODIMENT

The semiconductor devices of the present invention are applicable to a board range of semiconductor devices and can be fabricated from a variety of semiconductor materials. While the invention is described in terms of a single preferred embodiment, those skilled in the art will recognize that many steps described below can be altered without departing from the spirit and scope of the invention.

Furthermore, there is shown a representative portion of a semiconductor structure of the present invention in enlarged, cross-sections of the two dimensional views at several stages of fabrication. The drawings are not necessarily to scale, as the thickness of the various layers are shown for clarify of illustration and should not be interpreted in a limiting sense. Accordingly, these regions will have dimensions, including length, width and depth, when fabricated in an actual device.

In the present invention, a method for forming low dielectric constant layer in a semiconductor device comprises providing the semiconductor device. The dielectric layer is formed on the semiconductor device, which has a constituent of a plurality of unsaturated carbon bonds compounds and a pattern of a plurality of opening. The surface of the dielectric and side-wall of the opening are treated with hydrogen gas for formation saturated carbon bonds compounds.

Figure 1:
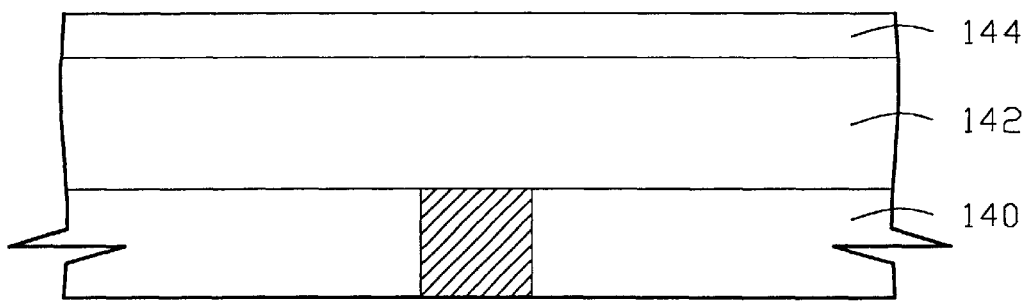
FIG. 1 is a cross-sectional schematic diagram illustrating low dielectric constant layer applied on a single damascene structure in accordance with the prior art.
Figure 2:
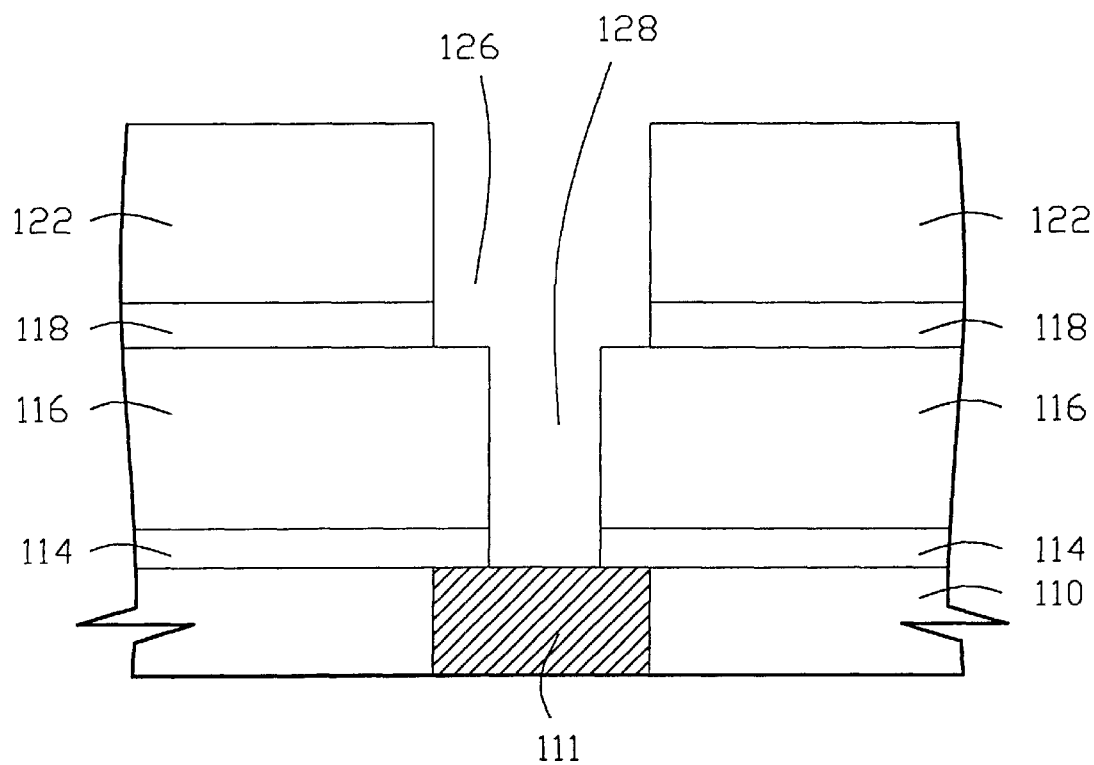
FIG. 2 is a cross-sectional schematic diagram illustrating low dielectric constant layer applied on a dual damascene structure in accordance with the prior art.
Figure 3A:
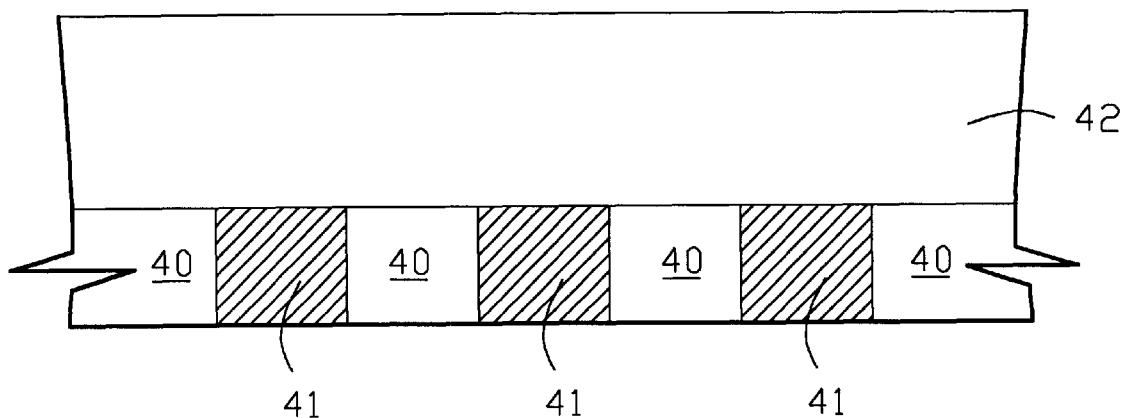
FIGS. 3A–3E are cross-sectional schematic diagrams illustrating low dielectric constant applied on a single damascene structure in accordance with the present invention.
Figure 3B:
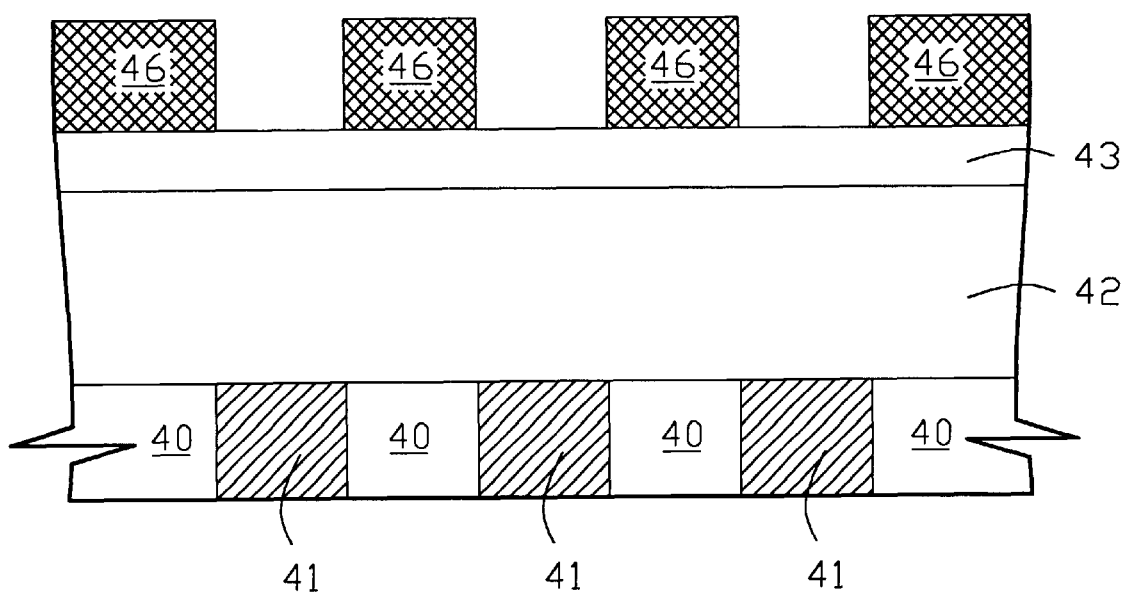

A first embodiment of the present invention is depicted in FIGS. 3A–3B, which show a cross-section of a interconnect portion of a semiconductor wafer to form a single damascene structure. A conductor 41 having a low resistivity, such as copper, is provided in an interconnect layer 40. A low k dielectric layer 42 is then formed by spin coating, for example, low k dielectric material on the interconnect layer 40 and the conductor 41. The low k dielectric layer 42 may be made of a suitable material, such as benzocyclobutene (BCB) or the commercially known material FLARE manufactured by Allied Signal. These materials are considered low k dielectric materials since their dielectric constant is less than about 4.

On the other hand, these materials have many unsaturated carbon bonds, such as double or triple bonds, for forming cross-linking in curing step. First for a curing step, the low k dielectric layer 42 is spun on the interconnect layer 40 and the conductor 41 in the environment with nitrogen or argon ambient and at a temperature in the range of about 100° C. to 450° C. Second for a saturation step, the low k materials continuously react with hydrogen in the environment with hydrogen ambient and at a temperature similar as those in curing step. The unsaturated carbon bonds of low k materials unexhausted in curing step are susceptible to moisture to form carboxyl functional groups with higher dielectric constant. The purpose of hydrogen is for forming saturated carbon bonds of unexhausted unsaturated carbon bonds in the low k material. The alkyl functional groups have lower dielectric constant than carboxyl groups do, so that the dielectric constant of the low k material can be uniformly maintained at low value.

Figure 3C:
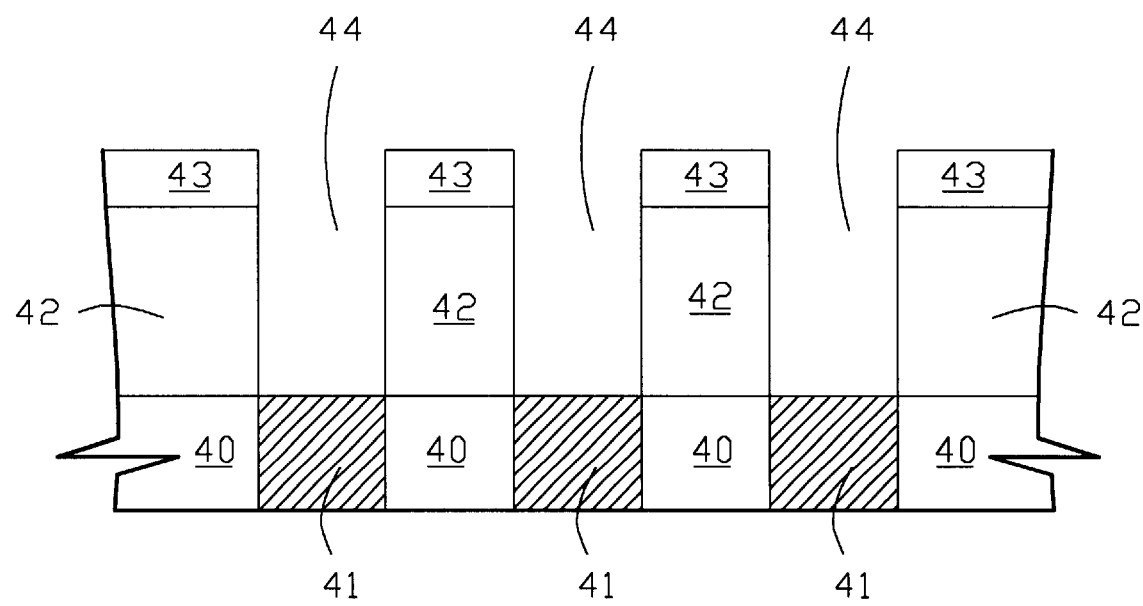
Figure 3D:
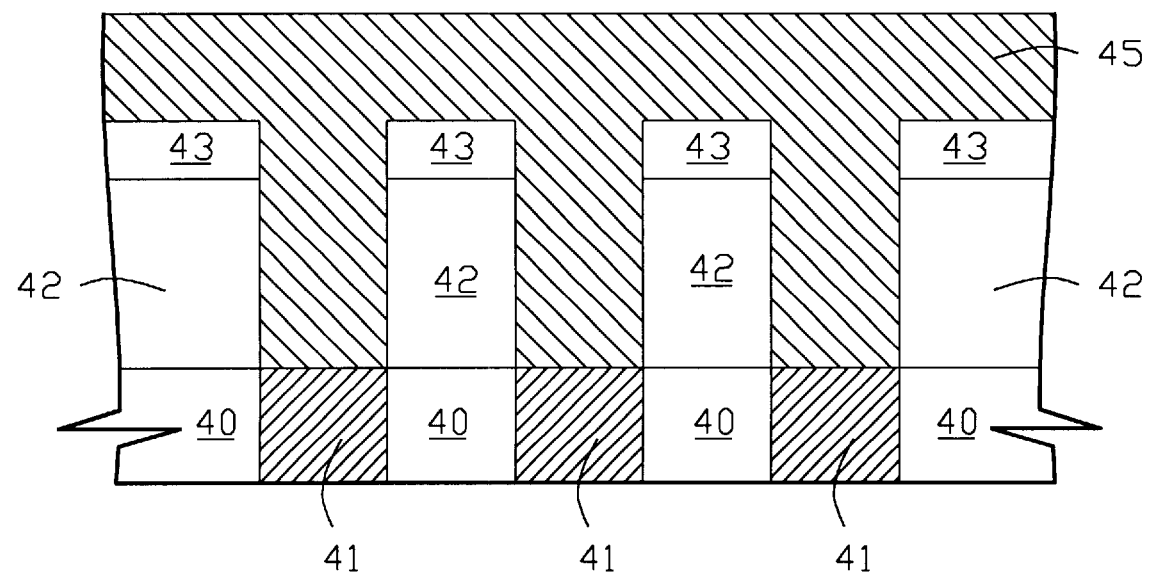
Figure 3E:
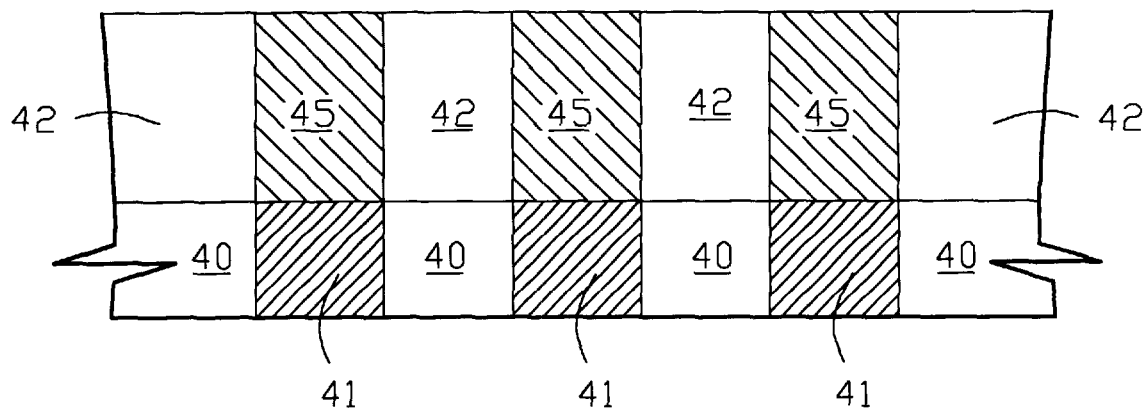

As depicted in FIG. 3B, a hard mask layer 43 is first formed on the low k dielectric layer 42. A photoresist layer 46 is formed on the hard mask 43 and is pattern-transferred. Shown in FIG. 3C, multitudes of vias 44 are formed within the low k dielectric layer 42 by using any suitable method. The vias 44 are formed by dry etching the low k dielectric layer 42 and the hard mask layer 43. Next, a metallic material 45, such as copper, is deposited in vias 44 and on the hard mask 43, shown in FIG. 3D. Depicted in FIG. 3E, the metallic material 45 is planarized by chemical mechanical polishing. During chemical mechanical polishing, it is possible for the hard mask 43 to be over-polished so as to expose the low k dielectric layer 42. The exposed low k dielectric layer 42 can't react with moisture and further form higher dielectric constant layer because of saturation treatment on the low k dielectric layer 42.

Figure 4:
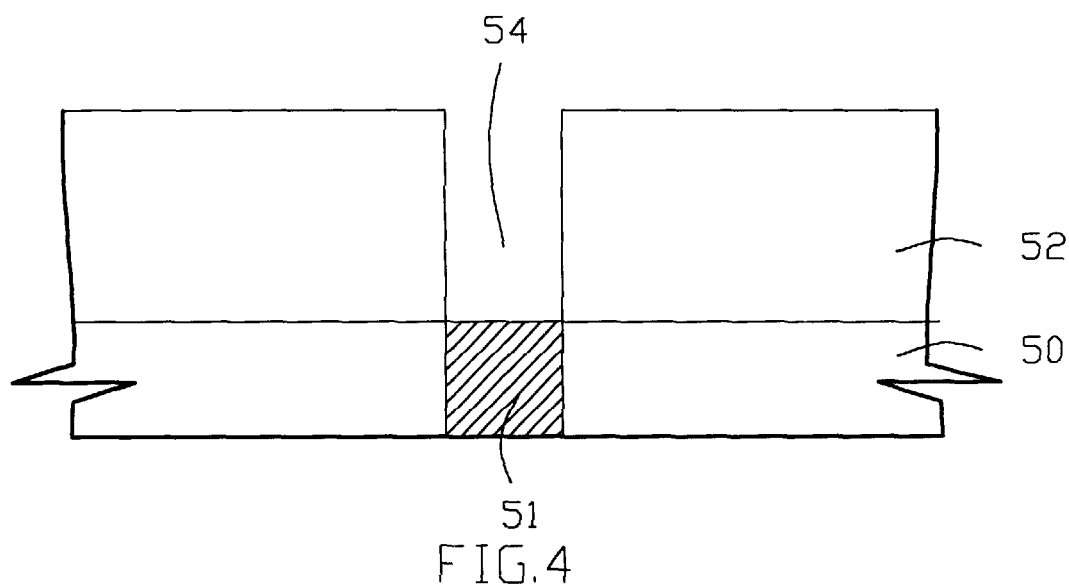
FIG. 4 is a cross-sectional another schematic diagrams illustrating low dielectric constant applied on a single damascene structure in accordance with the present invention.

Another example for the present invention is depicted in FIG. 4. A single damascene structure is first formed by the conventional steps. A via 54 on a top surface of conductor 51 is formed within a low k dielectric layer 52 on an interconnect layer 50. After formation of the via 52 and after-etching inspection (AEI), the top surface and side-wall of the via 52 of the low k dielectric layer are treated by reacting with hydrogen in the environment with hydrogen ambient. These unsaturated carbon bonds, such as double or triple bonds, are saturated with hydrogen on the top surface and side-wall of the via 52 of the low k dielectric layer 52. The saturation reaction is accomplished at a temperature in the range about 100° C. to 450° C.

It is an object of the present invention for preventing the unexhausted unsaturated carbon bonds of the low k materials from reacting with moisture that results in the formation of carboxyl groups with higher dielectric constant. The alkyl groups from reaction of unsaturated carbon bonds and hydrogen can't raise the dielectric constant of the material. It can be applied on single or double damascene structure.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for forming a low dielectric constant layer in a semiconductor device, said method comprising:

providing said semiconductor device;

spinning-on a dielectric layer on said semiconductor device, said dielectric layer having a constituent of a plurality of unsaturated carbon bonds compounds; and treating said dielectric layer with hydrogen.

2. The method according to claim 1 further comprising curing said dielectric layer in an environment with nitrogen ambient.

3. The method according to claim 1 further comprising curing said dielectric layer in an environment with argon ambient.

4. The method according to claim 1, wherein said dielectric layer comprises a constituent of a plurality of double carbon bonds compounds.

5. The method according to claim 1, wherein said dielectric layer comprises a constituent of a plurality of triple carbon bonds compounds.

6. The method according to claim 1, wherein a material of said dielectric layer is a low dielectric constant material.

7. The method according to claim 1, wherein said treating step is used for formation of a plurality of saturated carbon bonds compounds in said dielectric layer.

8. The method according to claim 1, wherein said treating step is accomplished at a temperature in range about from 100° C. to 450° C.

9. A method for forming a low dielectric constant layer in a semiconductor device, said method comprising:

providing said semiconductor device;

spinning-on a dielectric layer on said semiconductor device, said dielectric layer having a constituent of a plurality of unsaturated carbon bonds compounds and a pattern of a plurality of opening; and treating surface of said dielectric and side-walls of said opening with hydrogen gas.

10. The method according to claim 9 further comprising curing said dielectric layer in an environment with nitrogen ambient.

11. The method according to claim 9 further comprising curing said dielectric layer in an environment with argon ambient.

12. The method according to claim 9, wherein said dielectric layer comprises a constituent of a plurality of double carbon bonds compounds.

13. The method according to claim 9, wherein said dielectric layer comprises a constituent of a plurality of triple carbon bonds compounds.

14. The method according to claim 9, wherein a material of said dielectric layer is a low dielectric constant material.

15. The method according to claim 9, wherein said treating step is used for formation of a plurality of saturated carbon bonds compounds in said dielectric layer.

16. The method according to claim 9, wherein said treating step is accomplished at a temperature in range about from 100° C. to 450° C.

17. The method according to claim 9, wherein said semiconductor device comprises a plurality of conductors on an interconnect layer.

* * * * *